United States Patent
Shan et al.

(10) Patent No.: US 10,422,830 B2
(45) Date of Patent: Sep. 24, 2019

(54) PROCESS CORNER DETECTION CIRCUIT BASED ON SELF-TIMING OSCILLATION RING

(71) Applicant: Southeast University, Jiangsu (CN)

(72) Inventors: Weiwei Shan, Jiangsu (CN); Longxing Shi, Jiangsu (CN); Jun Yang, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 206 days.

(21) Appl. No.: 15/321,111

(22) PCT Filed: Dec. 26, 2014

(86) PCT No.: PCT/CN2014/095074
§ 371 (c)(1),
(2) Date: Mar. 8, 2017

(87) PCT Pub. No.: WO2015/196772
PCT Pub. Date: Dec. 30, 2015

(65) Prior Publication Data
US 2017/0219649 A1    Aug. 3, 2017

(30) Foreign Application Priority Data
Jun. 25, 2014 (CN) .......................... 2014 1 0291341

(51) Int. Cl.
*G01R 31/28* (2006.01)
*H03K 3/03* (2006.01)

(52) U.S. Cl.
CPC ..... *G01R 31/2882* (2013.01); *G01R 31/2837* (2013.01); *H03K 3/0315* (2013.01)

(58) Field of Classification Search
CPC ... G01R 31/2882; G01R 31/26; H03K 3/0315
See application file for complete search history.

(56) References Cited

U.S. PATENT DOCUMENTS 6,069,514 A * 5/2000 Fairbanks ................. G06F 1/10
 327/153
7,742,887 B2 * 6/2010 Patel ................. G01R 31/2882
 702/75

(Continued)

FOREIGN PATENT DOCUMENTS

CN  1886668 A  12/2006
CN  102655410 A  9/2012

(Continued)

OTHER PUBLICATIONS

International Search Report and Written Opinion by State Intellectual Property Office of the P.R. China of PCT/CN2014/095074, dated Apr. 1, 2015.

*Primary Examiner* — Akm Zakaria
(74) *Attorney, Agent, or Firm* — Edwin S. Flores; Chalker Flores, LLP

(57) ABSTRACT

A process corner detection circuit based on a self-timing ring oscillator comprises a reset circuit (1), the self-timing oscillation ring (2), and a counting module (3). The self-timing ring oscillator (2) consists of m two-input Muller C-elements and inverters, and a two-input AND gate, m being a positive integer greater than or equal to 3. The circuit can be used for detecting a process corner of a fabricated integrated circuit chip, and reflecting the process corner of the chip according to the number of oscillations of the self-timing ring oscillator (2). The number of oscillations of the self-timing ring oscillator (2) in different process corners is acquired by Hspice simulation before the chip tape-out, and the process corner of the chip after the chip tape-out can be determined according to the actually measured number of oscillations.

4 Claims, 3 Drawing Sheets

(56) References Cited

U.S. PATENT DOCUMENTS

2003/0095556 A1* 5/2003 Horie ............... G06F 13/28
                                                         370/405
2013/0106438 A1* 5/2013 Elkin ............... G01R 31/2882
                                                         324/617

FOREIGN PATENT DOCUMENTS

| CN | 103513173 A | 1/2014 |
| CN | 103915358 A | 7/2014 |
| CN | 104101827 A | 10/2014 |
| WO | 2015196772 A1 | 12/2015 |

* cited by examiner

PROCESS CORNER DETECTION CIRCUIT BASED ON SELF-TIMING OSCILLATION RING

CROSS-REFERENCE TO RELATED APPLICATIONS

This application is the National Stage of International Application No. PCT/CN2014/095074, filed on 26 Dec. 2014 claiming the priority of CN 201410291341.9 filed on 25 Jun. 2014, the content of each of which is incorporated by reference herein.

TECHNICAL FIELD

The present invention relates to a process corner detection circuit based on a self-timing ring oscillator, in which all circuit elements can be constituted by MOS transistors, and which is used for detecting the process corner of a fabricated integrated circuit chip, and belongs to the field of integrated circuit designs.

BACKGROUND

Guaranteeing that time delay changes of a timing path in a "timing safety" circuit of a circuit does not cause synchronization failure is one of the basic conditions for ensuring the circuit to work reliably. However, with manufacturing processes continuously advancing toward nano scale, the effect of variations of factors such as process, voltage, temperature (Process-Voltage-Temperature, PVT) on an integrated circuit timing gets larger and larger, and guaranteeing the timing safety becomes increasingly difficult and costly, thus making it an important research subject. In order to minimize effects on a chip timing caused by variations of factors such as PVT, it is essential to monitor PVT conditions while the chip is working, and adjust the chip according to monitored PVT information so as to guarantee that the chip timing is always correct.

In all of the factors affecting the chip timing, process variation is one of the main causes of timing fluctuation. It was said in International Technology Roadmap for Semiconductors (ITRS), 2011, that: Since the feature size is reduced, one of key problems faced by designers is that fluctuation of parameters related to a design is continuously increasing, because manufacturing parameters variations and the inherent characteristic of the atom affect channel doping. The process variation is caused by inconsistency of the manufacturing processes, being divided into global variation and local variation.

For the global variation, changes of device parameters such as oxidation layer thickness and doping concentration are the same for all transistors in the same chip. The process variations in different wafers or among chips in different batches all fall within this class. On the contrary, for the local variation (also known as mismatch or random uncorrelated variation), the effects on each transistor in the same chip are different.

The global variation describes differences of device parameters in different chips, while the device parameters in the same chip are regarded as the same. Simulation in different process corners is generally used to estimate the effect of the global variation. Each process corner is in an extreme situation, and the device parameters thereof substantially deviate from their typical values. For a fastest process corner (Fast Corner), all process fluctuations increase a drive current of the transistor, and therefore, the speed thereof is fastest. However, for a slowest process corner (Slow Corner), device speeds are slowed down by the process variation.

The effect of the process variation on different chip timings is usually in a normal distribution (an average value being $\mu_{global}$, and a variance being $\sigma_{global}$), the fastest and the slowest process corners are usually defined according to a multiple of $\sigma_{global}$ (such as 3 times or 6 times of $\sigma$) or performance statistical data obtained by means of segmentation test. For the segmentation test, the process parameters (doping concentration, oxidation layer thickness, etc.) are artificially set to be close to manufacturing the slowest or the fastest chip. Apart from the fastest and the slowest process corners, some crossing process corners, for example, consist of a fastest p channel transistor (p-FET) and a slowest n channel transistor (n-FET) or vice versa. Generally, a process base provides five process corners, that is, FF, FNSP, TT, SNFP and SS. FF represents that the circuit consists of a fastest p-FET and a fastest n-FET; TT represents that the circuit consists of a typical p-FET and a typical n-FET; SS represents that the circuit consists of a slowest p-FET and a slowest n-FET; FNSP and SNFP are crossing process corners, and FNSP represents that the circuit consists of a slowest p-FET and a fastest n-FET; and SNFP represents that the circuit consists of a fastest p-FET and a slowest n-FET. Generally, the crossing process corner is more critical in an analogue circuit, but secondary in a digital circuit.

The local variation is increasing as a CMOS process size is scaling. Scaling of a transistor size may cause a standard deviation $\sigma_{VT}$ of a threshold voltage and a current factor $\sigma_{k/k}$ ($k=\mu C_{OX} W/L$) to increase because they are proportional to the square root of the reciprocal of the area of an active region.

The effect of the local variation on a path delay may be described by n same logic gates with inversion time (rising or falling time) being $t_{gate}$ and a corresponding standard deviation being a $\sigma_{t,gate}$. The path delay $t_d = n \times t_{gate}$ increases linearly with n, but the standard deviation $\sigma_{t,d}$ is proportional to the square root of n, and therefore, a relative deviation $\sigma_{t,d}/t_d$ of the path delay is proportional to the square root of the reciprocal of n. Therefore, an absolute deviation of the path delay increases as the path increases, but the relative deviation decreases as the path increases.

With the evolution of the process, the effect of the process variation on the chip timing is increasingly severely under an advanced process. After fabricating the manufacture of the chip, each chip may in a different process corner, and the specific process corner of the chip cannot be learnt without corresponding process corner detection means. A ring oscillator is a most commonly used structure for detecting a process corner, and the principle thereof is to count the number of oscillations of the ring oscillator within a certain period, and when the process corner of the chip is relatively good, the time delay of the device is relatively small, and the number of oscillations of the ring oscillator within the same period is relatively large; and when the process corner of the chip is not good, the number of oscillations is relatively small, and therefore, a counting result of the number of the oscillations may reflect the process corner of the chip.

A logical structure generally adopted by a traditional ring oscillator is a ring formed by connecting an odd number of inverters end-to-end, and generates an oscillation waveform by using the time delay of the inverters and inverse functions thereof. The change of the process corner of the ring oscillator based on an inverter chain may change its oscillation frequency, but changes of the voltage and temperature may also affect the oscillation frequency. Although the effect of voltage fluctuations can be eliminated by using LDO supplying power to the circuit with stable and accurate voltage, the effect of temperature fluctuations on the ring oscillator cannot be eliminated. It can be found by HSPICE simulation that, in different process corners, there are overlaps in the counting result of the ring oscillator, that is, under two process corners, when a worse process corner is in a low temperature while a better process corner is in a high temperature condition, the counting range overlaps, thus, the process corner of the chip cannot be correctly distinguished by the counting result.

SUMMARY OF THE INVENTION

Objectives of the Invention

Currently, in the process of manufacturing an integrated circuit, the effect of process variation on a chip timing gets more severe, and in order to decrease the effect of the process variation on the chip timing, it is essential to take measures to minimize the effect of the process variation, which needs to detect the process corner of the chip firstly. The present invention aims to provide a process corner detection circuit based on a self-timing ring oscillator, which detects the specific process corner more accurately after the fabrication of the chip so as to provide a reliable basis to mitigate the effect of the process variation.

Technical Solutions

The process corner detection circuit based on a self-timing ring oscillator of the present invention comprises a reset circuit, a self-timing ring oscillator, and a counting module. The self-timing ring oscillator can reflect the condition of the process corner of the chip, and when the process corner of the chip is relatively good, the number of oscillations of the self-timing ring oscillator within the same period is relatively large; and when the process corner of the chip is not good, the number of oscillations is relatively small, and therefore, the number of the oscillations may reflect the process corner of the chip. The counting module is used for counting the number of the oscillations of the self-timing ring oscillator, and the counting result of the counting module reflects the condition of the process corner of the chip. The reset circuit is used for resetting the counting module after finishing a detection so as to perform next detection; and at the same time, the reset circuit can also set an initial state of the self-timing ring oscillator to ensure that the self-timing ring oscillator can start an oscillation.

The reset circuit is constituted by two flip-flops DR1 and DR2, a two-input OR gate OR1, a two-input NOR gate NOR1 and a two-input NAND gate NAND1; a data input port D of the flip-flop DR1 is connected to a divide-by-eight frequency signal CLK8 of a system clock, a clock port is connected to the system clock CLK, an output signal of a data output port Q is CLK8_1 which is connected to a data input port D of the flip-flop DR2, and an output signal of an inverted data output port $\overline{Q}$ of the flip-flop DR1 is CLK8_1$n$; a clock port of the flip-flop DR2 is connected to the system clock CLK, and an output signal of the data output port Q is CLK8_2 which is connected to an input port of the two-input OR gate OR1; the other input port of the two-input OR gate OR1 is connected to the divide-by-eight frequency signal CLK8 of the system clock; an output signal of the two-input OR gate OR1 is a reset signal RSTn of the counting module; the two input ports of the two-input NOR gate NOR1 are respectively connected to the signal CLK8_1 and the ground, and an output signal thereof is set1; the two input ports of the two-input NAND gate NAND1 are respectively connected to a power supply VDD and the signal CLK8_1$n$, and an output signal thereof is set0;

the self-timing ring oscillator is constituted by m two-input Muller C-elements and inverters, and a two-input AND gate AND1, where m is a positive integer greater than or equal to 3; the self-timing ring oscillator has m stages, each stage consisting of a Muller C-element and an inverter; an output of the inverter in each stage is connected to an input port of the Muller C-element in this stage, the input port of the inverter is connected to the output port of a Muller C-element in a next stage, and the input port of the inverter in the $m^{th}$ stage is connected to the output port of the Muller C-element in the first stage; the other input port of the Muller C-element in the first stage is connected to the output port of the two-input AND gate AND1; the other input port of each of the other Miller units is connected to the output port of the Muller C-element in a previous stage; an input port of the two-input AND gate AND1 is connected to the output port of the Muller C-element in the $m^{th}$ stage, and the other input port is connected to the output end Q of the flip-flop DR1; the output signal of the Muller C-element in the first stage serves as an output signal OSC_OUT of the self-timing ring oscillator;

the counting module is constituted by n flip-flops that have reset ports and are connected in series, n being a positive integer greater than or equal to 3; the counting module constituted has n stages, each stage being a flip-flop; the clock ports of all flip-flops are connected to the output signal OSC_OUT of the self-timing ring oscillator, and the reset ports all are connected to the reset signal RSTn output by the reset circuit; and the data input port of the flip-flop in the first stage is connected to the power supply VDD, and the data input port of the flip-flop in each stage thereafter is connected to the data output port of the flip-flop in a previous stage.

The number of 1s in the data output by the flip-flops in n stages in the counting module represents the number of the oscillations of the self-timing ring oscillator.

The present invention provides a process corner detection circuit based on a self-timing ring oscillator, which adopts a self-timing ring oscillator constituted by a Muller C-element and an inverter as a ring oscillator reflecting the condition of a process corner. Due to the influence of Charlie effect, time delay of the Muller C-element has a compensating effect on temperature change, and therefore, the self-timing ring oscillator is not sensitive to the temperature change. The so-called Charlie effect refers to the case where, since the output of the Muller C-element will change only when the two inputs are same, a toggle of the output port needs the two input ports to toggle once respectively, and the shorter the time interval between the toggles of the two input ports is, the larger the propagation time delay is; and on the contrary, the longer the time interval between the toggles of the two input ports is, the smaller the propagation time delay is. In the self-timing ring oscillator, when increase of the temperature causes the time delay of the Muller C-element in a certain stage to increase, and the increased time delay at the output port thereof causes the time interval between the toggles of the two input ports of the Muller C-element in next stage to increase, thus the propagation time delay of the Muller C-element in the next stage decreases, and therefore, the time delays in the previous and the next stages may compensate each other so that the time delay of the whole ring oscillator may maintain stability relatively. Therefore, the process corner detection circuit based on the self-timing ring oscillator may detect the process corner after fabrication of the chip more accurately so as to provide a basis for inhabiting the effect of the process variation, and further to improve the working stability of the chip.

Compared with the prior art, the beneficial effects of the present invention are as follows:

1. The present invention is all constituted by digital CMOS circuits, and compared with the analog device based process corner detection circuit, the circuit structures in the present invention are simple, the design process is friendly to an EDA tool, and the design difficulty is relatively low.

2. When the supply voltage is stable, the present invention is not sensitive to the effects of the temperature fluctuation, but is very sensitive to the effect of the process variation, and compared with the process corner detection circuit which adopts the inverter chain as the ring oscillator, the present invention can distinguish the process corner of the chip more accurately.

3. The present invention has a reset mechanism, which may reset the self-timing ring oscillator and the counting module after finishing a detection, and then performs detection again. Further, the self-timing ring oscillator has an enable control, which can be configured when the process corner detection is not needed, to enable the self-timing ring oscillator to stop oscillating so as to reduce circuit power consumption.

DETAILED DESCRIPTION

The technical solution of the present invention is described in detail as below, but the scope of protection of the present invention is not limited to the embodiments.

Embodiment 1

Figure 1:
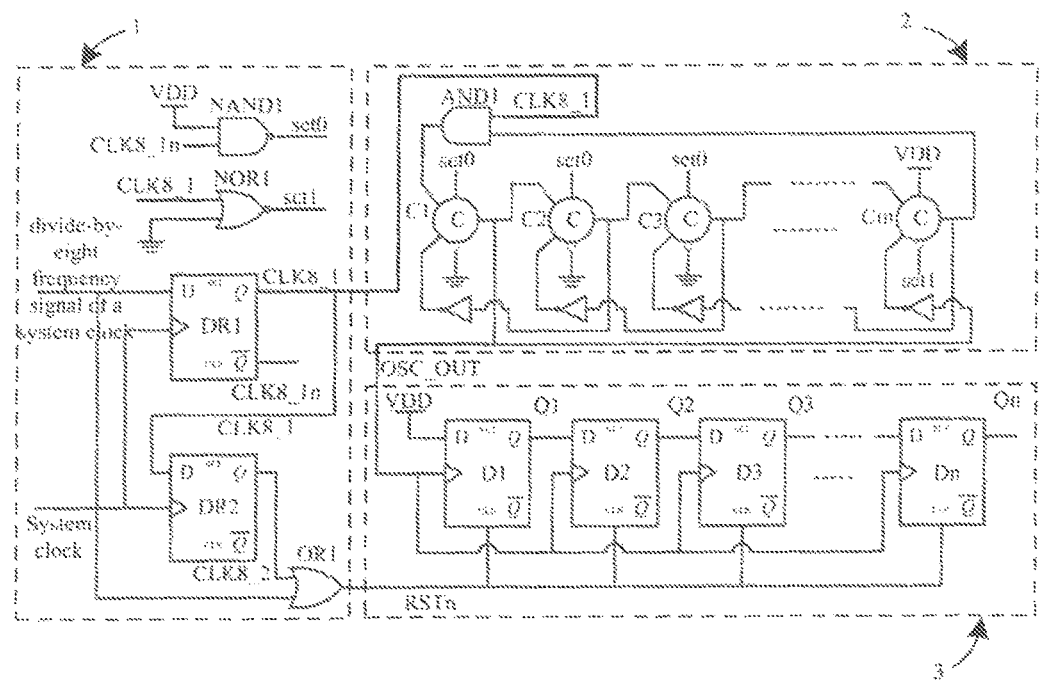
FIG. 1 is a structural block diagram of a circuit of the present invention.

As shown in FIG. 1, the process corner detection circuit based on a self-timing ring oscillator of the present invention comprises a reset circuit, a self-timing ring oscillator, and a counting module. The self-timing ring oscillator comprises at least three stages of Muller C-elements and inverters, and the counting module comprises at least three flip-flops. In different process corners, the numbers of the oscillations of the self-timing ring oscillator within the same period are different, and the number of the flip-flops in the counting module should be larger than the largest number of the oscillations of the self-timing ring oscillator during an oscillation period. When the stage of the Muller C-element and the inverter included in the self-timing ring oscillator is 9, and the stage of the flip-flop included in the counting module is 32, a detailed implementation is as follows:

As shown in FIG. 1, the reset circuit is constituted by two flip-flops DR1 and DR2, a two-input OR gate OR1, a two-input NOR gate NOR1 and a two-input NAND gate NAND1; a data input port D of the flip-flop DR1 is connected to a divide-by-eight frequency signal CLK8 of a system clock, a clock port is connected to the system clock CLK, an output signal of a data output port Q is CLK8_1 which is connected to a data input port D of the flip-flop DR2, and an output signal of an inverted data output port $\overline{Q}$ of the flip-flop DR1 is CLK8_1n; a clock port of the flip-flop DR2 is connected to the system clock CLK, and an output signal of a data output port Q is CLK8_2 which is connected to an input port of the two-input OR gate OR1; the other input port of the two-input OR gate OR1 is connected to the divide-by-eight frequency signal CLK8 of the system clock; an output signal of the two-input OR gate OR1 is a reset signal RSTn of the counting module; the two input ports of the two-input NOR gate NOR1 respectively are connected to CLK8_1 and the ground, and an output signal thereof is set1; and the two input ports of the two-input NAND gate NAND1 respectively are connected to a power supply VDD and CLK8_1n, and the output signal thereof is set0.

Figure 4:
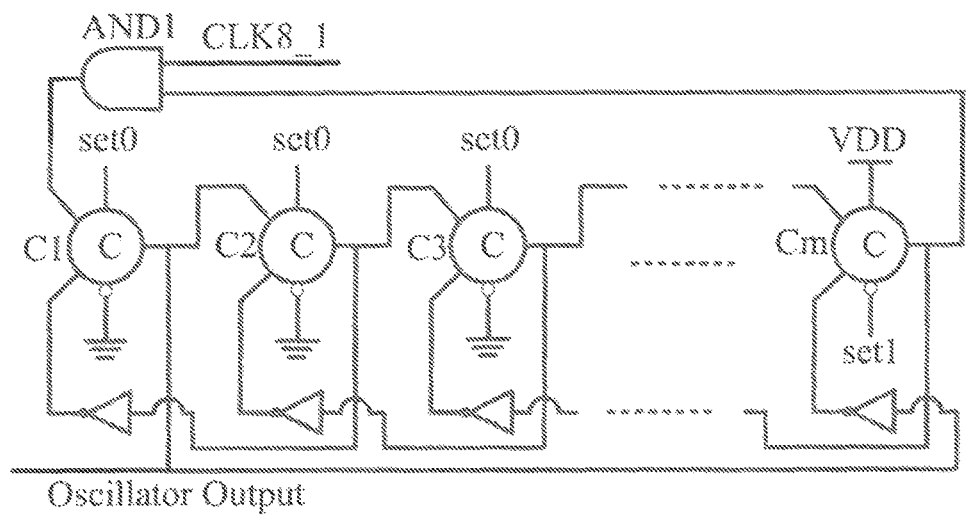
FIG. 4 is a circuit diagram of a self-timing ring oscillator in the present invention.

As shown in FIG. 4, the self-timing ring oscillator is constituted by 9 two-input Muller C-elements and inverters, and a two-input AND gate AND1; the self-timing ring oscillator has 9 stages, each stage consisting of a Muller C-element and an inverter; the output of the inverter in each stage is connected to an input port of the Muller C-element in this stage, the input port of the inverter is connected to the output port of the Muller C-element in next stage, and the input port of the inverter in the ninth stage is connected to the output port of the Muller C-element in the first stage; an input port of the Muller C-element in the first stage is connected to the output port of the two-input AND gate AND1, the other input port of the Muller C-element in each of the other stages is connected to the output port of the Muller C-element in a previous stage, an input port of the two-input AND gate AND1 is connected to the output port of the Muller C-element in the ninth stage, and the other input port is connected to the output port Q of the flip-flop DR1; and the output signal of the Muller C-element in the first stage serves as the output signal OSC_OUT of the self-timing ring oscillator.

The counting module is constituted by 32 flip-flops that have reset ports and are connected in series; the counting module constituted has 32 stages, each stage being a flip-flop; the clock ends of all flip-flops are connected to an oscillation output signal OSC_OUT of the self-timing ring oscillator, and the reset ports all are connected to the reset signal RSTn output by the reset circuit; and the data input port of the flip-flop in the first stage is connected to a high level (the power supply VDD), and the data input port of the flip-flop in each stage thereafter is connected to the data output port of the flip-flop in a previous stage.

Figure 2:
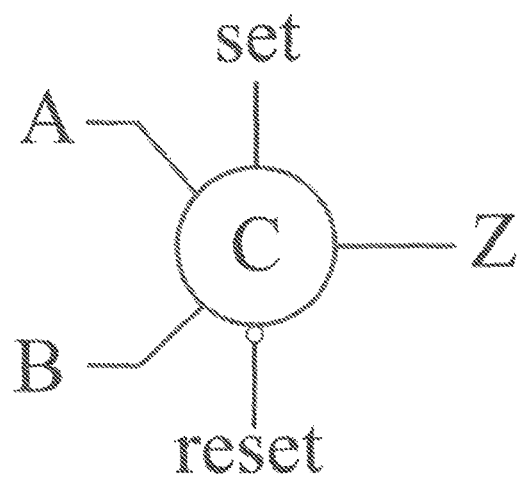
FIG. 2 is a logical symbol of a Muller C-element having a reset port and a set port in the present invention.

The Muller C-element in each stage of the self-timing ring oscillator has a reset port 'reset' and a set port 'set', as shown in FIG. 2, wherein the reset port 'reset' clears an output value of the Muller C-element, and the set port 'set' sets the output value of the Muller C-element so as to set an initial state of the self-timing ring oscillator.

Figure 3:
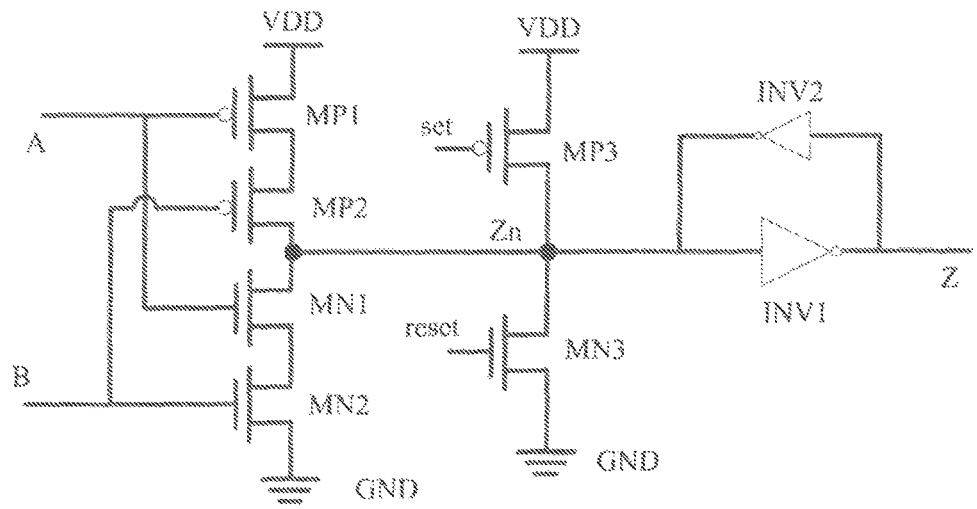
FIG. 3 is a circuit diagram of the Muller C-element in the present invention.

The Muller C-element having the reset port 'reset' and the set port 'set' is constituted by three PMOS transistors MP1, MP2 and MP3, three NMOS transistors MN1, MN2 and MN3 and two inverters INV1 and INV2, which has two input ports A and B, and an output port Z, as shown in FIG. 3; the source of MP1 is connected to the power supply VDD, the gate is connected to an input signal A, and the drain is connected to the source of MP2; the gate of MP2 is connected to an input signal B, and the drain is connected to the drain of MN1; the gate of MN1 is connected to the input signal A, and the source is connected to the drain of MN2; the gate of MN2 is connected to the input signal B, and the source is connected to the ground GND; the source of MP3 is connected to the power supply VDD, and the gate is connected to a set signal 'set', and the drain is connected to a node Zn connecting the drain of MP2 and the drain of MN1; the drain of MN3 also is connected to Zn, the gate is connected to the reset signal 'reset', and the source is connected to the ground GND; the input port of the inverter INV1 to Zn, and the output port thereof is the output port Z of the Muller C-element; at the same time, Z is connected to the input port of the inverter INV2, and the output port of the inverter INV2 also is connected to Zn; and the aspect ratios of MP1, MP2 and MP3 are the same as the aspect ratio of the NMOS in the inverter INV1, and the aspect ratios of MN1, MN2 and MN3 are the same as the aspect ratio of the PMOS in the inverter INV1, but the aspect ratios of the PMOS and the NMOS transistors in the inverter INV2 are respectively at least less than half of the aspect ratios of the PMOS and the NMOS transistors in the inverter INV1.

The initial output states of the Muller C-elements of the first eight stages in the self-timing ring oscillator before an oscillation are set to be 0, and the initial output state of the Muller C-element of the ninth stage before an oscillation is set to be 1; the set ports 'set' of the Muller C-elements of the first 8 stages are all connected to an output signal set0 of NAND1, and the reset ports 'reset' are all connected to the ground; and the set port 'set' of the Muller C-element of the ninth level is connected to the power supply VDD, and the reset port 'reset' is connected to the output signal set1 of NOR1.

The number of is in the data output by the flip-flops in 32 stages in the counting module represents the number of the oscillations of the self-timing ring oscillator; and the counting result of the counting module reflects the condition of the process corner of the chip.

Figure 5:
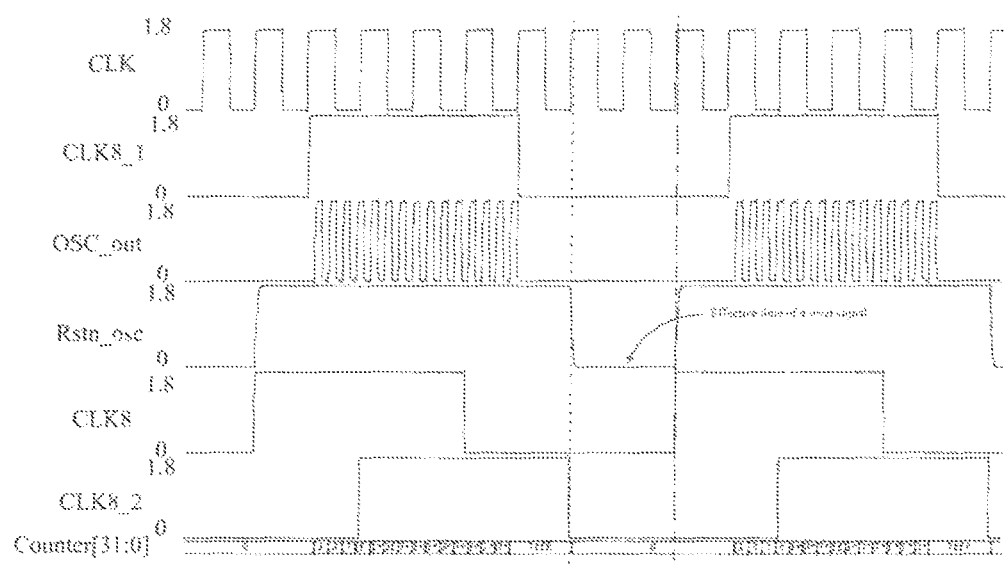
FIG. 5 is an HSPICE simulation result diagram of the circuit in the conditions of an SS process corner, 1.8 V and 125° C. in the present invention.

After finishing the design of the process corner detection circuit based on the self-timing ring oscillator, the HSPISE tool is used to perform simulation. The HSPICE simulation result of the process corner detection module is shown in FIG. 5, the process adopted by the circuit is SMIC 0.18 μm CMOS process, and the corresponding PVT conditions are an SS process corner, 1.8 V and 125° C. CLK in FIG. 5 is the system clock, OSC_out is the output of the self-timing ring oscillator, Rstn_osc is the reset signal of the counting module, and Counter [31:0] is the output of the flip-flops in 32 stages in the counting module. It can be seen from the figure that, during the period that the enabling signal CLK8_1 of the self-timing ring oscillator is at a high level, the ring oscillator outputs oscillations, while when CLK8_1 is at a low level, there is no oscillation; the reset signal Rstn_osc is a value after performing OR operation on CLK8 and CLK8_2, which is exactly valid during two central clock periods when CLK8_1 is at a low level; and during the period that CLK8_1 is at a high level, the ring oscillator oscillates for 15 times totally, and the output value Counter [31:0] of the counting module is 7fff, containing fifteen 1, which is the same as the number of the oscillations of the ring oscillator.

The process corner detection module is simulated with different process corners and at different temperatures, and the obtained counting result of the ring oscillator is as shown in Table 1. It can be seen from Table 1 that when the chip is in an SS process corner, the number of oscillations of the ring oscillator ranges from 15 to 17; when the chip is in a TT process corner, the number of oscillations of the ring oscillator ranges from 19 to 21; and when the chip is in an FF process corner, the number of oscillations of the ring oscillator ranges from 24 to 27. In different process corners, there is no overlaps in the counting result when temperature changes.

TABLE 1

The Number of Oscillations of Self-Timing Oscillator at 1.8 V in Different Process Corners and at Different Temperatures

| Process Corner | Temperature | | | |
|---|---|---|---|---|
| | 125° C. | 50° C. | 25° C. | −25° C. |
| SS | 15 | 16 | 16 | 17 |
| TT | 19 | 20 | 20 | 21 |
| FF | 24 | 25 | 26 | 27 |

In Table 1, 125° C. corresponds to a very extreme situation, whereas the process corner detection is performed after powering up the chip and before starting work, and at this time, the temperature of the chip may be regarded to be the same as the environment temperature, and does not reach the extreme situation. Therefore, when the process corner is determined according to the counting result of the ring oscillator, it is possible to take into account only the counting result within a normal variation range of environment temperature, i.e., situations between −25° C. and 50° C. Specific determination values are as shown in Table 2.

TABLE 2

Process corner determination methods corresponding to counting results

| Counting results N | Determination result |
|---|---|
| 16 ≤ N ≤ 17 | SS process corner |
| 18 ≤ N ≤ 19 | Process corner between SS and TT |
| 20 ≤ N ≤ 21 | TT process corner |
| 22 ≤ N ≤ 24 | Process corner between TT and FF |
| 25 ≤ N ≤ 27 | FF process corner |

It can be seen from Table 2 that when the counting result is 16 or 17, it can be determined that the chip is in an SS process corner; when the counting result is 18 or 19, it can be determined that the chip is in a process corner between SS and TT; when the counting result is from 20 to 21, it can be determined that the chip is in a TT process corner; when the counting result is from 22 to 24, it can be determined that the chip is in a process corner between TT and FF; and when the counting result is from 25 to 27, it can be determined that the chip is in an FF process corner.

As stated above, although the present invention has been shown and illustrated with reference to specific preferred embodiments, it should not be interpreted as limiting of the present invention itself. Various changes in form and detail may be made on the present invention without departing from the spirit and scope thereof as defined by the appended claims.

What is claimed is:

1. A process corner detection circuit based on a self-timing ring oscillator, comprising a reset circuit, a self-timing ring oscillator, and a counting module, wherein the reset circuit is constituted by two flip-flops DR1 and DR2, a two-input OR gate OR1, a two-input NOR gate NOR1 and a two-input NAND gate NAND1; a data input port of the flip-flop DR1 is connected to a divide-by-eight frequency signal CLK8 of a system CLK, a clock port is connected to the system clock CLK, an output signal of a data output port is CLK8_1 which is connected to a data input port of the flip-flop DR2, and an output signal of an inverted data output port of the flip-flop DR1 is CLK8_1n; a clock port of the flip-flop DR2 is connected to the system clock CLK, and an output signal of a data output port is CLK8_2 which is connected to an input port of the two-input OR gate OR1; the other input port of the two-input OR gate OR1 is connected to the divide-by-eight frequency signal CLK8 of the system clock; an output signal of the two-input OR gate OR1 is a reset signal RSTn of the counting module; two input terminals of the two-input NOR gate NOR1 are connected to the output signal CLK8_1 and a ground GND respectively, and an output signal of NOR1 is set1; two input terminals of the two-input NAND gate NAND1 are connected to a power supply VDD and the signal CLK8_1n respectively, and an output signal of NAND1 is set0;

the self-timing ring oscillator is constituted by m two-input Muller C-elements and inverters, and a two-input AND gate AND1, m being a positive integer greater than or equal to 3; the self-timing ring oscillator has m stages, each stage consisting of a Muller C-element and an inverter; an output of the inverter in each stage is connected to an input port of the Muller C-element in this stage, the input port of the inverter is connected to the output port of a Muller C-element in a next stage, and the input port of the inverter in the $m^{th}$ stage is connected to the output port of the Muller C-element in the first stage; the other input port of the Muller C-element in the first stage is connected to the output port of the two-input AND gate AND1; the other input port of each of the other Muller C-elements is connected to the output port of the Muller C-element in a previous stage; an input port of the two-input AND gate AND1 is connected to the output port of the Muller C-element in the $m^{th}$ stage, and the other input port is connected to the output port Q of the flip-flop DR1; the output signal of the Muller C-element in the first stage serves as an output signal OSC_OUT of the self-timing ring oscillator; and the counting module is constituted by n flip-flops that have reset ports and are connected in series, n being a positive integer greater than or equal to 3; the counting module has n stages, each stage being a flip-flop; the clock ports of all flip-flops are connected to the output signal OSC_OUT of the self-timing ring oscillator, and all the reset ports are connected to the reset signal RSTn output by the reset circuit; and the data input port of the flip-flop in each of the other stages is connected to the power supply VDD, and the data input port of the flip-flop in each of the other stages is connected to the data output port of the flip-flop in a previous stage.

2. The process corner detection circuit based on a self-timing ring oscillator according to claim 1, wherein the Muller C-element in each stage of the self-timing ring oscillator has a reset port 'reset' and a set port 'set', wherein the reset port 'reset' clears an output value of the Muller C-element, and the set port 'set' sets the output value of the Muller C-element for setting an initial state of the self-timing ring oscillator.

3. The process corner detection circuit based on a self-timing ring oscillator according to claim 2, wherein the Muller C-element having the reset port 'reset' and the set port 'set' is constituted by three PMOS transistors MP1, MP2 and MP3, three NMOS transistors MN1, MN2 and MN3, two inverters INV1 and INV2; it has two input ports A and B, and an output port Z; the source of the PMOS transistor MP1 is connected to the power supply VDD, the gate is connected to an input signal A, and the drain is connected to the source of the PMOS transistor MP2; the gate of the PMOS transistor MP2 is connected to an input signal B, and the drain is connected to the drain of the NMOS transistor MN1; the gate of the NMOS transistor MN1 is connected to the input signal A, and the source is connected to the drain of the NMOS transistor MN2; the gate of the NMOS transistor MN2 is connected to the input signal B, and the source is connected to the ground GND; the source of the PMOS transistor MP3 is connected to the power supply VDD, and the gate is connected to a set signal, and the drain is connected to a node Zn connecting the drain of the PMOS transistor MP2 and the drain of the NMOS transistor MN1; the drain of the NMOS transistor MN3 also is connected to Zn, the gate is connected to the reset signal reset, and the source is connected to the ground GND; the input port of the inverter INV1 is connected to Zn; and the output port thereof is the output port Z of the Muller C-element; at the same time, Z is connected to the input port of the inverter INV2, and the output port of the inverter INV2 is also connected to Zn.

4. The process corner detection circuit based on a self-timing ring oscillator according to claim 2, wherein initial output states of the Muller C-elements of the first m−1 stages in the self-timing ring oscillator are set to be 0, and the initial output state of the Muller C-element of the $m^{th}$ stage is set to be 1; the set ports 'set' of the Muller C-elements of the first m−1 stages are all connected to the output signal set0 of the two-input NAND gate NAND1, and the reset ports 'reset' are all connected to the ground; and the set port 'set' of the Muller C-element of the $m^{th}$ stage is connected to the power supply VDD, and the reset port 'reset' is connected to the output signal set1 of the two-input NOR gate NOR1.

* * * * *